United States Patent [19]

Stephens

[11] 4,091,297
[45] May 23, 1978

[54] SAMPLE-AND-HOLD CIRCUIT

[76] Inventor: Thomas W. Stephens, P.O. Box 6190, Austin, Tex. 76762

[21] Appl. No.: 638,262

[22] Filed: Dec. 8, 1975

Related U.S. Application Data

[63] Continuation of Ser. No. 431,421, Jan. 7, 1974, abandoned.

[51] Int. Cl.² ............... G11C 27/02; H03K 5/20
[52] U.S. Cl. ............................. 307/353; 307/351; 307/358; 328/151
[58] Field of Search ............ 307/230, 353, 358, 237, 307/351; 328/151, 127, 128; 235/183

[56] References Cited

U.S. PATENT DOCUMENTS 3,328,705  6/1967  Eubanks ............... 328/151

Primary Examiner—John Zazworsky

[57] ABSTRACT

A unique slope-controlled crest detector and sample-and-hold circuit for determining the peak values of a fluctuating input signal and providing a control signal indicating the time of occurrence of the peak value. This circuit successfully eliminated undesirable filtering and phase delay from the data path while incorporating adequate filtering to the slope sensing circuitry to allow good operation with poor signal-to-noise ratio on the input signal.

3 Claims, 2 Drawing Figures

SAMPLE-AND-HOLD CIRCUIT

CROSS-REFERENCE TO RELATED APPLICATIONS

This application is a continuation of the U.S. patent application Ser. No. 431,421 filed Jan. 7, 1974, now abandoned. Su

BACKGROUND OF THE INVENTION

1. Field of the Invention

This invention relates to more rapidly detecting and processing peak data signals.

2. Description of the Prior Art.

In a mass spectrometer, for example, a sample to be analyzed is ionized and the resulting positive ions are subjected first to an accelerating voltage and then to a magnetic deflection field. If the accelerating voltage and magnetic field intensity are of the proper values, then ions of a particular mass number (number of protons and neutrons in a nucleus) are caused to pass through a narrow exit slit suitably located relative to the point at which the ions enter the magnetic field. The intensity or magnitude of the ion current through the exit slit is proportional to the quantity of the element or isotope of that particular mass number which is present in the sample being analyzed.

By varying either the accelerating voltage or the magnetic field intensity as a function of time, ions of different mass numbers are caused to pass through the exit slit at different times. If the resulting ion current signal is recorded as a function of the varied parameter or of time, then the identity and the relative proportions of the different elements or isotopes contained in the sample can be determined from such a record. The mass number values at which the ion current peaks occur identify the elements or isotopes present, while the relative heights of the peaks indicate the relative amounts of these elements or isotopes. The mass number values are determined from the accelerating voltage and magnetic field intensity values at the different times.

The input to a digital readout system from such an analytical instrument as a mass spectrometer are twofold. First, there is the fluctuating signal, or voltage. Second, there is a control voltage. The control voltage may be thought of as the address data for the fluctuating signal. That is, by sweeping or scanning the magnetic field, accelerating voltage or other control variable of the mass spectrometer, data fluctuations are produced. The data therein is related to the value on the ramp voltage that produces the sweep or scan.

One common method of sampling analog data used in prior art peak detectors may be referred to as the fixed rate sampling system. This system may be best described by way of example. Assume that a signal excursion from onset through peak and finishing at offset is 2,000 milliseconds long. Twenty samples may be taken during this time at 100 millisecond intervals. For many slow speed purposes such a system is suitable in that twenty samples are satisfactory to reconstruct the trace, even if the actual peak does not fall at one of the sample occurrences. However, assume a signal of much shorter duration. For example, assume a signal has a period of 200 milliseconds, 20 milliseconds, or even 2 milliseconds. Obviously the sampling occurences would have to be more frequent to properly define the overall curve. When used with a mass spectrometer, such a sampling system may not accurately detect some peaks within acceptable limits. Also, when operating such a system to obtain high speed sampling, time does not permit data processing "on the fly" to produce mass numbers related to the sampled peaks. Furthermore, compromise attempts to produce more meaningful data results in lessening the quality. Broadening the exit slit width to get more samples per peak results in decreasing the resolution. Moreover, if the sampling rate is increased then the sampling time must be decreased. In this event, the dynamic range suffers.

By way of comparison, the system described in U.S. Pat. No. 3,733,601 operates optimumly to detect 5-10 peaks per second. At this rate, the dynamic range of such a system is about 10,000:1. However, at its near maximum operating speed of detection 40 peaks per second, the dynamic range is only about 2,000:1.

Thus one of the principal areas in a detection system requiring improvement over the prior art is the requirement for an advance in the state of the art peak crest determining circuits. Conventional crest detection circuits are either susceptable to small amplitude noise on the input signal or induce significant amounts of time delay between actual peak occurrence and circuit detection of the peak. Also most crest detection circuits are not capable of discriminating against the low frequency data content of the input signal. Most crest detection circuits also have a very limited dynamic range, especially for fast signals.

It is a feature of the present invention to provide an improved method of sampling and processing data to provide meaningful results from the signals of one scan of data while collecting the signals for another scan of data.

It is yet another feature of the present invention to provide an improved sample-and-hold circuit with wide dynamic range and whose output is not affected by the switching energy of a control signal.

SUMMARY OF THE INVENTION

Detection of the peak crest values is achieved by unidirectional tracking of the fluctuations which have a leading-edge slope within a predetermined range as determined by a filtered slope sensing circuit (thereby rejecting both low and high frequencies that are not related to information data), by then holding the tracked peak while validating the peak signal with the filtered slope sensing circuit.

BRIEF DESCRIPTION OF THE DRAWINGS

So that the manner in which the above-recited features, advantages and objects of the invention, as well as others which will become apparent, are attained and can be understood in detail, more particular description of the invention briefly summarized above may be had by reference to the embodiments thereof which are illustrated in the appended drawings, which drawings form a part of this specification. It is to be noted, however, that the appended drawings illustrate only typical embodiments of the invention and are therefore not to be considered limiting of its scope, for the invention may admit to other equally effective embodiments.

In the drawings.

DESCRIPTION OF PREFERRED EMBODIMENTS

Figure 1:
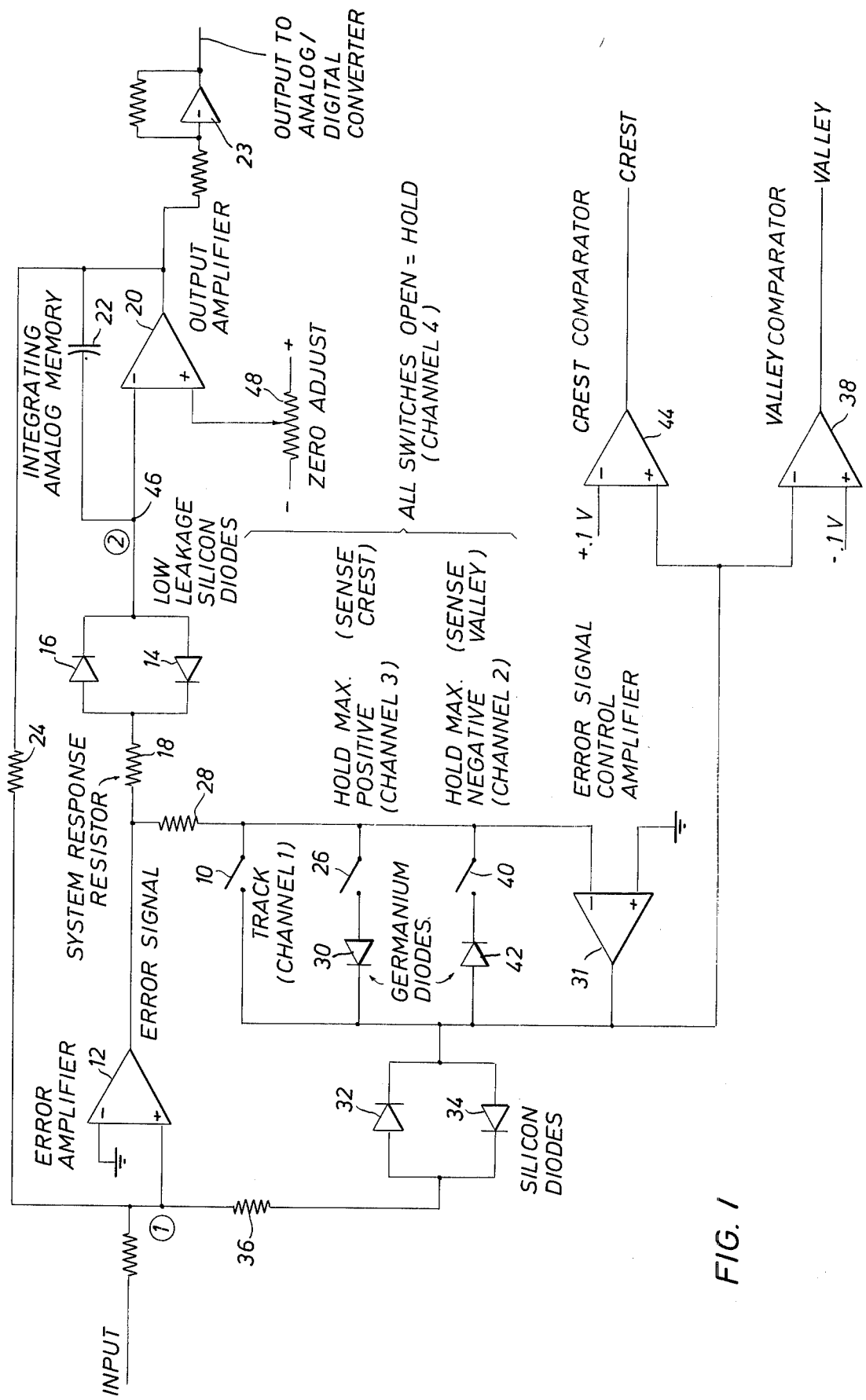
FIG. 1 is a block diagram of the crest detector and sample-and-hold circuit portions of the present invention.
Figure 2:
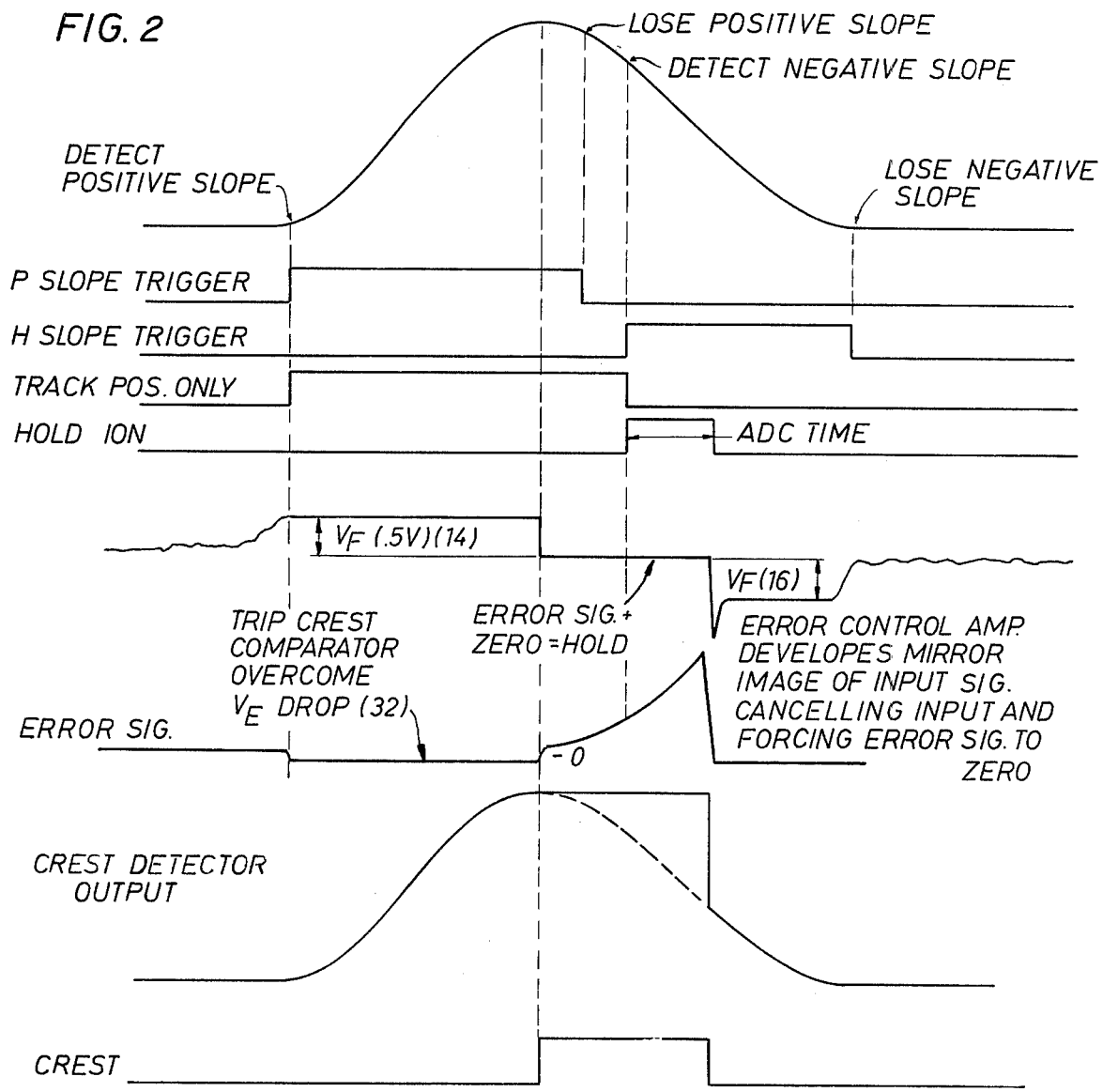
FIG. 2 is a waveform diagram of the operation of the illustrated embodiment of the present invention.

Now referring to FIGS. 1 and 2, the crest detector and sample-and-hold circuits in conjunction with the desired operation, is illustrated. The top curve illustrated in FIG. 2 is the applied fluctuation signal to be detected. While the curve is at its initial low level, switch 10 is closed and the circuit is in what may be referred to as channel 1 or "track" mode operation. Switch 10 may be an FET switch or may, with the switches in the other channels to be explained hereafter, be part of a multi-input amplifier, such as Harris Semiconductor (Harris Semiconductor Division of Harris Intertype Corp.) type HA-2400 or the like. In any event, the logic signal for operating the switch, that is, supplying a "track" condition signal, is derived from a peak sensor circuit (not shown), which senses the presence of a positive or negative slope condition in excess of a predetermined value.

In this track mode, the input to high gain operational amplifier 12 is positive (or negative) at a low level. This creates an output from amplifier 12 which is very much more positive (or negative) than the input to amplifier 12 and which overcomes the forward bias of diode 14 or 16 via resistor 18. Diodes 14 and 16 are low leakage silicon diodes. The input from diodes 14 and 16 is applied to an FET input operational amplifier 20, connected as a Miller effect integrator with capacitor 22 providing 100 percent of direct feedback to the amplifier. Hence, any change in the output of amplifier 20 is due to the current input through diodes 14 and 16. The output of amplifier 20 is of opposite polarity than the input applied to amplifier 12, this output being supplied back to the input of amplifier 12 through resistor 24. This supplied back signal opposes the input, and keeps the "error" signal from amplifier 12 at a low level, within the frequency spectrum of interest. Amplifier 23 may be used to invert the output of amplifier 20, if desired.

When the peak sensor circuit detects a positive slope, a positive slope logic signal is supplied to the circuit to actuate switch 26 (and to open switch 10), or to initiate so-called channel 3 or "peak hold" operation. In channel 3 operation, this circuit continually senses the increasing level of the positivegoing signal, but holds the value of the maximum signal should the applied signal ever decrease. Now the output of amplifier 12 is supplied through resistor 28 to the negative input of amplifier 31. Diode 30, a germanium diode, operates as a negative voltage clamp for amplifier 31 in a manner to be explained. It is characteristic of a germanium diode to have a forward voltage drop that is about one-third of the voltage drop of a silicon diode. So, therefore, when diode 30 begins to conduct it begins to supply 100 percent degenerative feedback to error signal control amplifier 31, and hence, zero gain results.

Assume that the signal input to amplifier 12 is positive. The positive-going voltage applied to the amplifier results in a very much greater positive output therefrom, as with the channel 1 track operation. This produces a slight negative voltage at the output of amplifier 31 (which is clamped by diode 30, which is the input to silicon diodes 32 and 34. However, the voltage will not be sufficient to overcome the forward bias of these diodes and therefore the operation of amplifiers 12 and 20 and their associated components is the same as previously described. Namely, this operation is that the output from amplifier 20 will be determined by the input to amplifier 12.

At the crest of the peak, the positive input signal (represented by the positive curve in the top waveform of FIG. 4) becomes static and then begins to go less positive. Note that the logic signals applied to the circuit still keep the circuit operation in channel 3 operating condition in that the negative slope trigger is not yet produced. When the net input to amplifier 12 through resistors 24 and 25 goes negative, the output tries to go very much more negative because of the extremely high gain of amplifier 12. Now, extremely high gain operational amplifier 31 is permitted to rapidly go positive since germanium diode 30 is then back biased, providing no clamping feedback. Note that both amplifiers 12 and 31 are contributing to this and therefore the output is produced so fast that the time that is required for this action to take place is virtually undetectable.

When the output of amplifier 31 goes positive, diode 34 conducts and supplies via resistor 36 an input to amplifier 12 to oppose the net negative input to amplifier 12 through resistors 24 and 25. The output of amplifier 12 is reduced to virtually zero. That is, the bucking signal is so complete that even though the input to amplifier 12 through resistor 25 becomes significantly less positive than the peak value, the output of 31 increases at virtually the same pace to keep the voltage applied to resistor 18 at a near zero level. This may be observed by viewing the "error signal" waveform following crest detection. When the error signal is zero, neither diode 14 nor 16 is forward biased and the output from amplifier 20 "holds" at a constant level. It should be further observed that, as no active switching is done at the summing point input to amplifier 20, no error is introduced by switching transient energy.

Connected to the output of amplifier 31 is a clamped high-speed operational amplifier 44 connected as a Schmitt trigger and operating as the crest detector. The almost instantaneous output from amplifier 31 produces the crest logic signal for operation of the control voltage channel.

When the peak sensor circuit detects a negative slope, then so-called absolute "hold" or channel 4 operation is initiated. At this time, all switches around amplifier 31 are opened and amplifier 31 is permitted to follow absolutely the input applied thereto, up or down. It is during this period that the analog-to-digital converter is converting the held crest value to a digital format and performing other logic functions, as is hereafter explained. In any event, channel 4 operation may be thought of as overriding all other modes.

The input of amplifier 20 is a current summing point 46. That is, the point is not tied to ground, but it is adjusted to near zero by zero adjust variable resistor 48. The gain of the operational amplifier is extremely high, on the order of 100,000, and therefore the voltage at the input is extremely low, on the order of 10 microvolts. This type of circuit is well known and may be referred to as a Miller effect integrator. Characteristic of such an integrator is that the voltage run up of the output is linear with a linear increase in applied current. Also it is characteristic that the device is not sensitive to a change in voltage at the input, only to the applied current. Therefore, when the error voltage applied to diodes 14 and 16 is zero, there is not enough bias voltage to cause these diodes to conduct. Hence, the input to amplifier 20 is effectively disconnectd without any switching having taken place. The output voltage remains constant (or nearly so), because of the near perfect capacitor action of capacitor 22 and the extremely low input current of operational amplifier 20. The leak-off or drop rate may readily be made less than 100 microvolts per second, which for purpose of this circuit operation is so long as to be non-significant.

When a related ADC (not shown) is through, it produces a signal that returns the circuit shown in FIG. 1 to the initial "track" conditions, or channel 1 operation. It should be noted that the output of amplifier 20 has been kept from tracking the input until channel 1 conditions return. When these conditions return, the operation of amplifier 31 is immediately terminated and the error signal rapidly rises. This produces a rapid catch up of the output of amplifier 20 with the input to amplifier 12 in the manner previously explained for the track or channel 1 operating conditions.

The control voltage signal is stored for comparison to a digital value in a sample-and-hold circuit operation similar to that which has been described except that there is no crest detection and the hold or channel 4 operation is initiated by the crest logic signal from amplifier 44, as described above. That is, amplifiers similar to amplifiers 12 and 20 as described above track the control voltage until a crest signal puts the sample-and-hold circuit into channel 4 condition. After the control voltage is converted to a digital value in either a separate ADC or in a properly time shared ADC, as in the preferred embodiment, for handling both the fluctuating signal and the control voltage signal, the operation returns to track or channel 1 operating condition.

Note that there is a channel 2 operation for the circuit shown in FIG. 1 which has not been described. Such operation would include the closing of switch 40 connected to germanium diode 42, diode 42 being connected to produce a clamping action on amplifier 31 on the application of a negative error signal via resistor 28. Operation would be identical to channel 3 operation, except that minimums or valleys would be sensed rather than maximums or crests. A valley comparator 38, similar to crest comparator 44, would produce a logic-type signal at the instant of minimum occurrence.

While only particular embodiments of the invention have been shown, it will be understood that the invention is not limited thereto, since many modifications may be made and will become apparent to those skilled in the art.

What is claimed is:

1. In a sample and hold circuit comprising an error amplifier to receive an input signal, an output amplifier, an integrating component connected to said output amplifier, said output amplifier being responsive to the output of the error amplifier, and said output amplifier supplying feedback to the input of the error amplifier, the improvement comprising:

an amplifier responsive to the output of the error amplifier for supplying feedback to the input of the error amplifier to reduce the output of the error amplifier to approximately zero volts; and an isolation device connected between said error amplifier and said output amplifier for isolating the input of the output amplifier from the output of the error amplifier when the output of the error amplifier is reduced to approximately zero volts.

2. In the sample and hold circuit of claim 1, wherein said isolation device comprises first and second diodes coupled between the output of the error amplifier and the input of the output amplifier, said first diode being forward biased by a positive voltage of the output of the error amplifier and said second diode being forward biased by the negative voltage at the output of the error amplifier.

3. In the sample and hold circuit of claim 1, wherein the improvement additionally comprises:

a second amplifier coupled to the output of the output amplifier for converting the polarity of the signal at the output of the output amplifier to a desired polarity.

* * * * *